United States Patent
Zou et al.

(10) Patent No.: US 11,495,315 B1
(45) Date of Patent: Nov. 8, 2022

(54) CONFIGURABLE BUILT-IN SELF-REPAIR CHAIN FOR FAST REPAIR DATA LOADING

(71) Applicant: Siemens Industry Software Inc., Plano, TX (US)

(72) Inventors: Wei Zou, Lake Oswego, OR (US); Benoit Nadeau-Dostie, Gatineau (CA)

(73) Assignee: Siemens Industry Software Inc., Plano, TX (US)

( * ) Notice: Subject to any disclaimer, the term of this patent is extended or adjusted under 35 U.S.C. 154(b) by 0 days.

(21) Appl. No.: 17/399,104

(22) Filed: Aug. 11, 2021

(51) Int. Cl.
  *G11C 29/00* (2006.01)
  *G11C 29/10* (2006.01)
  *G11C 29/32* (2006.01)
  *G11C 29/12* (2006.01)
  *G11C 29/44* (2006.01)

(52) U.S. Cl.
  CPC ........ *G11C 29/10* (2013.01); *G11C 29/12015* (2013.01); *G11C 29/32* (2013.01); *G11C 29/4401* (2013.01); *G11C 29/789* (2013.01)

(58) Field of Classification Search
  CPC ... G11C 29/10; G11C 29/12015; G11C 29/32; G11C 29/4401; G11C 29/789
  See application file for complete search history.

(56) References Cited

U.S. PATENT DOCUMENTS

| | | | |
|---|---|---|---|
| 2008/0288838 A1* | 11/2008 | Anzou | G11C 29/32 714/726 |
| 2015/0012786 A1 | 1/2015 | Varadarajan et al. | |
| 2015/0270016 A1 | 9/2015 | Varadarajan et al. | |
| 2016/0284426 A1* | 9/2016 | Busi | G11C 29/12 |
| 2019/0228829 A1* | 7/2019 | Hiraga | H01L 21/822 |

* cited by examiner

*Primary Examiner* — Christine T. Tu

(57) ABSTRACT

A scan network configured to transport repair information between memories and a controller for a non-volatile storage device comprises: repair registers coupled in parallel to repair information generation circuitry for one of the memories and segment selection devices that divide the repair registers into repair register segments. Each of the segment selection devices comprises: a storage element configured to store a segment selection bit and segment selection bit generation circuitry configured to generate the segment selection bit based on the repair information. Each of the segment selection devices is configurable to include or not include the corresponding repair register segment in a scan path of the scan network in a shift operation based on the segment selection bit.

24 Claims, 14 Drawing Sheets

Flow chart for configuration chain length determination 500

Flow chart for effective chain length determination
600

Flow chart for power up
700

CONFIGURABLE BUILT-IN SELF-REPAIR CHAIN FOR FAST REPAIR DATA LOADING

FIELD OF THE DISCLOSED TECHNIQUES

The presently disclosed techniques relates to embedded memory test and repair. Various implementations of the disclosed techniques may be particularly useful for loading and storing repair information.

BACKGROUND OF THE DISCLOSED TECHNIQUES

Current high-density semiconductors often include embedded memories. Designed tightly to the technology limits, memories are more prone to failures than other circuits, which can affect not only manufacture yield but circuit reliability adversely. Built-in self-test (BIST) techniques are typically employed to identify defects and problems in the memories. Moreover, a circuit having embedded memories usually includes built-in self-repair (BISR) circuitry for performing a repair analysis (built-in repair analysis or BIRA) and for replacing faulty elements with spare ones. Repair information obtained by the built-in self-repair (BISR) circuitry can be stored in a non-volatile storage device such as a fuse box. When the circuit is powered up, the repair information can be retrieved and loaded. The transportation of the repair information between the memories and the fuse box involves a scan network, which is often referred to as a repair chain. Data delivery via a single scan network is serial in nature. A circuit can have hundreds or thousands of memories. Using a conventional scan network can take too long time for manufacture and in-system test and repair.

BRIEF SUMMARY OF THE DISCLOSED TECHNIQUES

Various aspects of the disclosed technology relate to configurable built-in self-repair chain for loading memory repair data. In one aspect, there is a scan network in a circuit configured to transport repair information independently or along with one or more other networks between a plurality of memories and a controller for a non-volatile storage device, comprising: a plurality of repair registers, each of the plurality of repair registers comprising one or more scan cells which are coupled in parallel to repair information generation circuitry for one of the plurality of memories; and a plurality of segment selection devices, the plurality of segment selection devices dividing the plurality of repair registers into a plurality of repair register segments, each of the plurality of segment selection devices comprising: a storage element configured to store a segment selection bit, and segment selection bit generation circuitry configured to generate the segment selection bit based on the repair information generated by the repair information generation circuitry coupled to repair registers in one of the plurality of repair register segments for which the segment selection bit is generated, wherein the each of the plurality of segment selection devices is configurable to include or not include the one of the plurality of repair register segments in a scan path of the scan network in a shift operation based on the segment selection bit.

At least one repair register segment in the plurality of repair register segments may comprise more than one repair registers. The plurality of segment selection devices dividing the plurality of repair registers into the plurality of repair register segments may employ an algorithm for achieving an objective of a number of scan cells in each of the plurality of repair register segments being close to a number derived by dividing a total number of scan cells in the plurality of repair register segments by a total number of the plurality of repair register segments. The total number of the plurality of repair register segments may be derived by computing a square root of one half of a product of the number of scan cells in the plurality of repair register segments and a number of repair register segments estimated to be included on the scan path (an estimated number of repair register segments in which memories have defects).

The segment selection bit generation circuitry may comprise a one-detection device configurable to generate the segment selection bit. The one-detection device may comprise a storage element on the scan path, and each of the plurality of segment selection devices may further comprise a zero-injection device with an output coupled to a serial input of the one of the plurality of repair register segments, the zero-injection device configurable to output a constant "0" during a process for generating the segment selection bit. Alternatively, the one-detection device may comprise a storage element outside the scan path.

The controller for the non-volatile storage device may be configurable to enable the scan network to perform a one-detection process, the one-detection process comprises: loading the repair information from the repair information generation circuitry into the plurality of repair registers; injecting bits of "0" continuously at a serial input of each of the plurality of repair register segments; and applying a number of clock cycles equal to or greater than greatest length of a repair register segment within the plurality of repair register segments, length of a particular repair register segment being equal to a total number of scan cells in repair registers in the particular repair register segment.

The controller for the non-volatile storage device may be configurable to enable the scan network to perform a process of configuration chain length determination, the process of configuration chain length determination comprises: injecting a leading bit of "1" at a serial input of the scan network; applying clock cycles to the scan network with each of the plurality of repair register segment being in a bypass mode until the leading bit of "1" appears at a serial output of the scan network; and storing a number of the clock cycles applied as configuration chain length.

The controller for the non-volatile storage device may be configurable to enable the scan network to perform a process of effective chain length determination, the process of effective chain length determination comprises: injecting a leading bit of "1" at a serial input of the scan network; applying a number of clock cycles to the scan network with each of the plurality of segment selection devices being controlled by the segment selection bit until the leading bit of "1" appears at a serial output of the scan network; and storing a number of the clock cycles applied as the effective chain length.

The controller for the non-volatile storage device may be configurable to enable the scan network to perform a power-up process, the power-up process comprises: resetting the scan network; injecting a leading bit of "1" followed by segment selection bits derived based on data stored in the non-volatile storage device at a serial input for the scan network; applying first clock cycles to the scan network with each of the plurality of repair register segment being in a bypass mode until the leading bit of "1" appears at a serial output of the scan network; updating configuration chain length based on a number of first clock cycles applied or reporting error if detected; injecting a leading bit of "1" followed by bits of the repair information derived based on data stored in the non-volatile storage device at the serial input for the scan network; applying second clock cycles to the scan network with each of the plurality of segment selection devices being controlled by the segment selection bit until the leading bit of "1" appears at the serial output of the scan network; and updating effective chain length based on a number of second clock cycles applied or reporting error if detected.

The controller for the non-volatile storage device may be configurable to enable the scan network to operate in a programming process, the programming process comprises: performing a power-up process; performing a test on the plurality of memories to generate new repair information; performing a one-detection process to generate new segment selection bits based on the new repair information; applying a number of clock cycles equal to configuration chain length to the scan network with each of the plurality of repair register segments being in a bypass mode to shift the new segment selection bits to the controller for the non-volatile storage device for storing and to update the storage element in each of the plurality of segment selection devices with the new segment selection bits; performing a process of effective chain length determination based on the new segment selection bits to generate a new effective chain length; loading the new repair information from the repair information generation circuitry into the plurality of repair registers; and applying a number of clock cycles equal to the new effective chain length to the scan network with the segment selection devices being controlled by the new segment selection bits to shift the new repair information to the controller for the non-volatile storage device for storing.

In another aspect, there is one or more computer-readable media storing computer-executable instructions for causing a computer to perform a method, the method comprising: creating, in a circuit design, the above scan network.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed techniques. Thus, for example, those skilled in the art will recognize that the disclosed techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

Various aspects of the disclosed technology relate to configurable built-in self-repair chain for loading memory repair data. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

The detailed description of a method or a device sometimes uses terms like "couple," "generate," and "perform" to describe the disclosed method or the device function/structure. Such terms are high-level descriptions. The actual operations or functions/structures that correspond to these terms will vary depending on the particular implementation and are readily discernible by one of ordinary skill in the art.

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked and includes both direct connections or direct links and indirect connections or indirect links through one or more intermediate elements not affecting the intended operation of the circuit.

Figure 1:
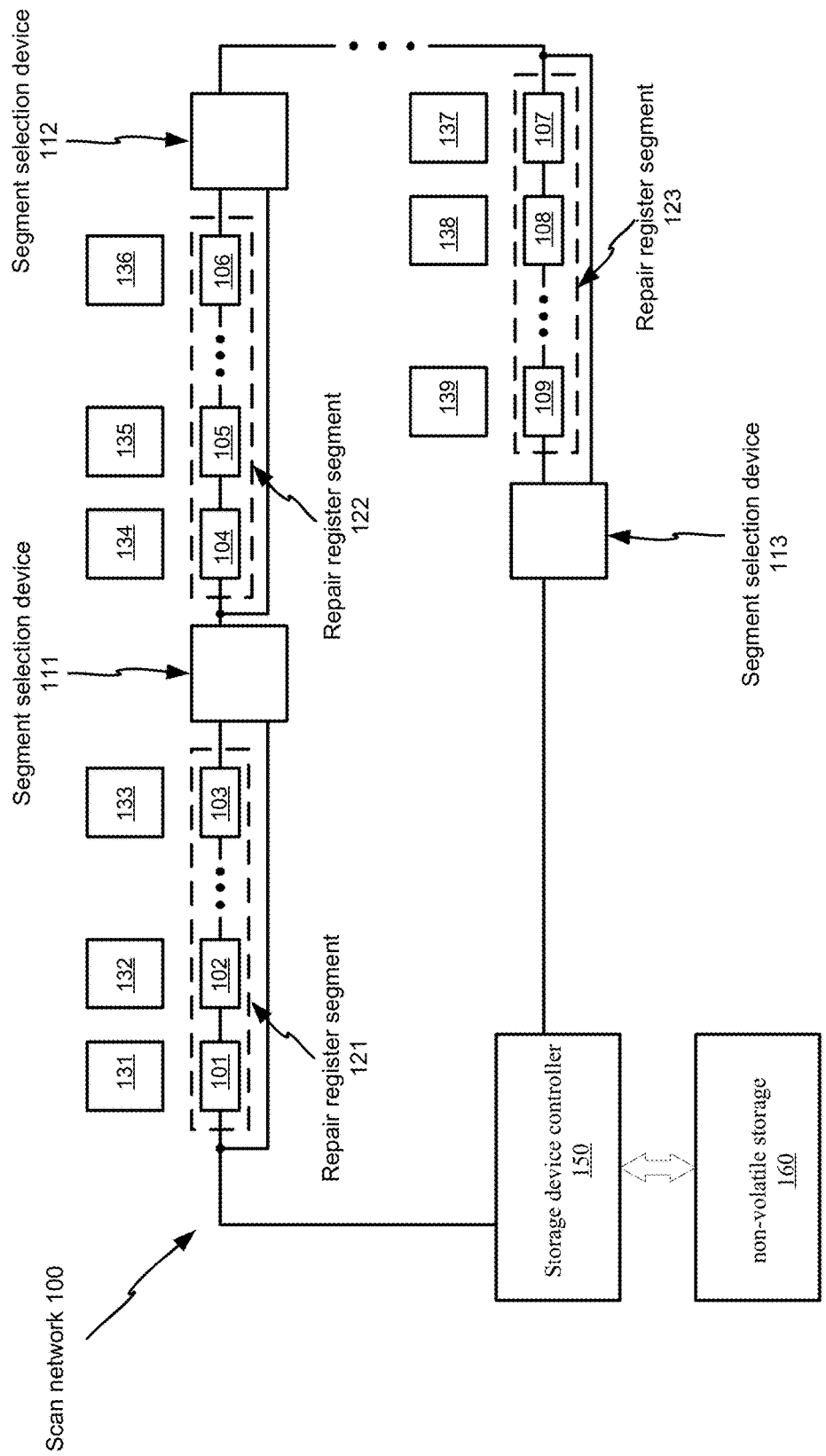
FIG. 1 illustrates an example of a block diagram of a scan network configured to transport repair information between a plurality of memories and a controller for a non-volatile storage device according to various embodiments of the disclosed technology.

FIG. 1 illustrates an example of a block diagram of a scan network 100 configured to transport repair information between a plurality of memories comprising memories 131-139 and a controller 150 for a non-volatile storage device 160 according to various embodiments of the disclosed technology. One or more BIST (built-in self-test) controllers may be used to perform a test on the memories 131-139. Based on the test, repair information generation circuitry can generate the repair information. The scan network 100 comprises repair registers 101-109. Each of the repair registers 101-109 comprises one or more scan cells which are coupled in parallel to the repair information generation circuitry for one of memories 131-139. The repair registers 101-109 can receive the repair information from the corresponding repair information generation circuitry and supply the repair information to the corresponding memories to repair failing elements such as words, rows, or columns.

The scan network 100 can shift the repair information to the controller 150. The controller 150 can program the repair information into the non-volatile storage device 160. The non-volatile storage device 160 retains the repair information even when the circuit is powered off. An example of the non-volatile storage device 160 is a fuse bank. In some applications, the repair information is compressed before being stored in the non-volatile storage device 160. The controller 150 can perform the compression and decompression of the repair information. During the circuit power up, the controller 150 can read the information from the non-volatile storage device 160 and shift the repair information to any of the repair registers 101-109 for the memories that need repair. The repair information can then be applied those memories.

The scan network 100 further comprises segment selection devices 111-113. The segment selection devices 111-113 divides the repair registers 101-109 into three repair register segments 121-123. The repair register segment 121 comprises the repair registers 101-103, the repair register segment 122 comprises the repair registers 104-106, and the repair register segment 123 comprises the repair registers 107-109. Each of the segment selection devices 111-113 comprises a storage element configured to store a segment selection bit, and segment selection bit generation circuitry configured to generate the segment selection bit based on the repair information generated by the repair information generation circuitry. Each of the segment selection devices 111-113 is configurable to include or not include the corresponding repair register segment in a scan path of the scan network in a shift operation based on the segment selection bit stored in it. The segment selection bits can be scanned into the controller 150 for storing in the non-volatile storage device 160. The controller 150 can provide signals for controlling the segment selection bit generation operation and loading/unloading the repair information and the segment selection bits.

Assume that only the memory 135 needs repair based on a memory test. The segment selection bit generation circuitry in the repair register segment 122 sets the segment selection bit to be in an active state while the segment selection bit generation circuitry in the repair register segments 121 and 123 sets the corresponding segment selection bits to be in an inactive state. As a result, the scan path of the scan network 100 for transporting the repair information will pass through the repair registers 104, 105 and 106 but bypasses the repair registers 101, 102, 103, 107, 108, and 109. Via the shortened scan path, the repair information for the memory 135 can be transported from the repair register 105 to the controller 150 for storing in the non-volatile storage device 160 and from the controller 150 to the repair register 105 to be applied to the memory 135. Without shifting through the other repair register segments, the shifting time is significantly reduced. For modern circuits that can contain hundreds or even thousands of memories, the shifting time can be reduced by two orders of magnitude. Another scan path that bypasses all of the repair registers but passes through scan elements in the segment selection devices be used to transport the segment selection bits between the non-volatile storage device controller and the repair registers.

With various implementations of the disclosed technology, segment selection devices can divide repair registers into repair register segments with roughly equal lengths (or with roughly equal numbers of scan cells). The total number of repair register segments can affect the loading/unloading time of the repair information via the scan network. The loading/unloading time of the repair information includes not only the time for shifting the repair information, but also the time for shifting the segment selection bits. Eq. (1) can be used to represent the loading/unloading time of the repair information:

$$T = C \times \left( Nrepair \times \frac{L}{Nseg} + 2 \times Nseg \right) \quad (1)$$

where Nrepair is the number of the repair register segments where one or more memories need repair, Nseg is the total number of the repair register segments on the scan network, L is the length of the scan network considering only scan cells in the repair registers (i.e., the total number of scan cells in the repair registers on the scan network), and C is a constant converting the number of scan cells into time. The first term in the bracket of Eq. (1) represents the time for shifting the repair information through the scan cells in the repair register segments where the memory repair is needed, and the second term in the bracket of Eq. (1) represents the time for shifting the repair information through scan elements in each of the segment selection devices (assuming one scan cell in each segment selection device) plus the time to load/unload the segment selection bits into/from the segment selection devices. For the loading/unloading time of the repair information T to reach the minimum, the derivative of T in Eq. (1) with respect to Nseg needs to be zero:

$$-Nrepair \times \frac{L}{Nseg^2} + 2 = 0 \quad (2)$$

Solving Eq. (2):

$$N_{seg} = \sqrt{N_{repair} \times L/2} \quad (3)$$

According to Eq. (3), the optimal value of Nseg depends on Nrepair which represents the chip defect density. For a mature process, the value of Nrepair is typically 1 or 2.

Assume that a circuit has 800 repair registers, the average number of scan cells in a repair register is 8, and Nrepair is 2. Using Eq. (2), an optimal number of repair register segments is computed to be 80. However, it may not be trivial to partition the scan network into 80 repair register segments of about equal lengths. Not all repair registers have the same length. Moreover, some memories may be inside a reused circuit block (also referred to as semiconductor intellectual property core or IP block) and the corresponding repair registers need to be kept in one repair register segment. A heuristic algorithm such as the greedy algorithm can be employed for the partition. For example, repair registers can be placed into the first repair register segment until the size of the repair register segment is about I/Nseg. Then the repair register segment right after the first repair register segment is formed in a similar way. The process can be repeated until all of the intended repair register segments are formed.

In FIG. 1, the scan network 100 is shown to be connected directly to the controller 150. In this case the scan network 100 can transport the repair information directly between the memories 131-139 and the controller 150. In some other embodiments of the disclosed technology, the scan network 100 may be connected indirectly to the controller 150 via one or more other networks. To speed up the data delivery speed, for example, the scan network 100 may be configurable to be connected to a data streaming network, and the data streaming network may be configurable to be connected to the controller 150. One example for using a data streaming network to speed up data delivery involving a serial network is described in a PCT (Patent Cooperation Treaty) international application No. PCT/US2021/038797, filed on Jun. 24, 2021, titled "High Bandwidth IJTAG Through High Speed Parallel Bus," and naming Jean-François Côté et al. as inventors, which application is incorporated entirely herein by reference.

Figure 2:
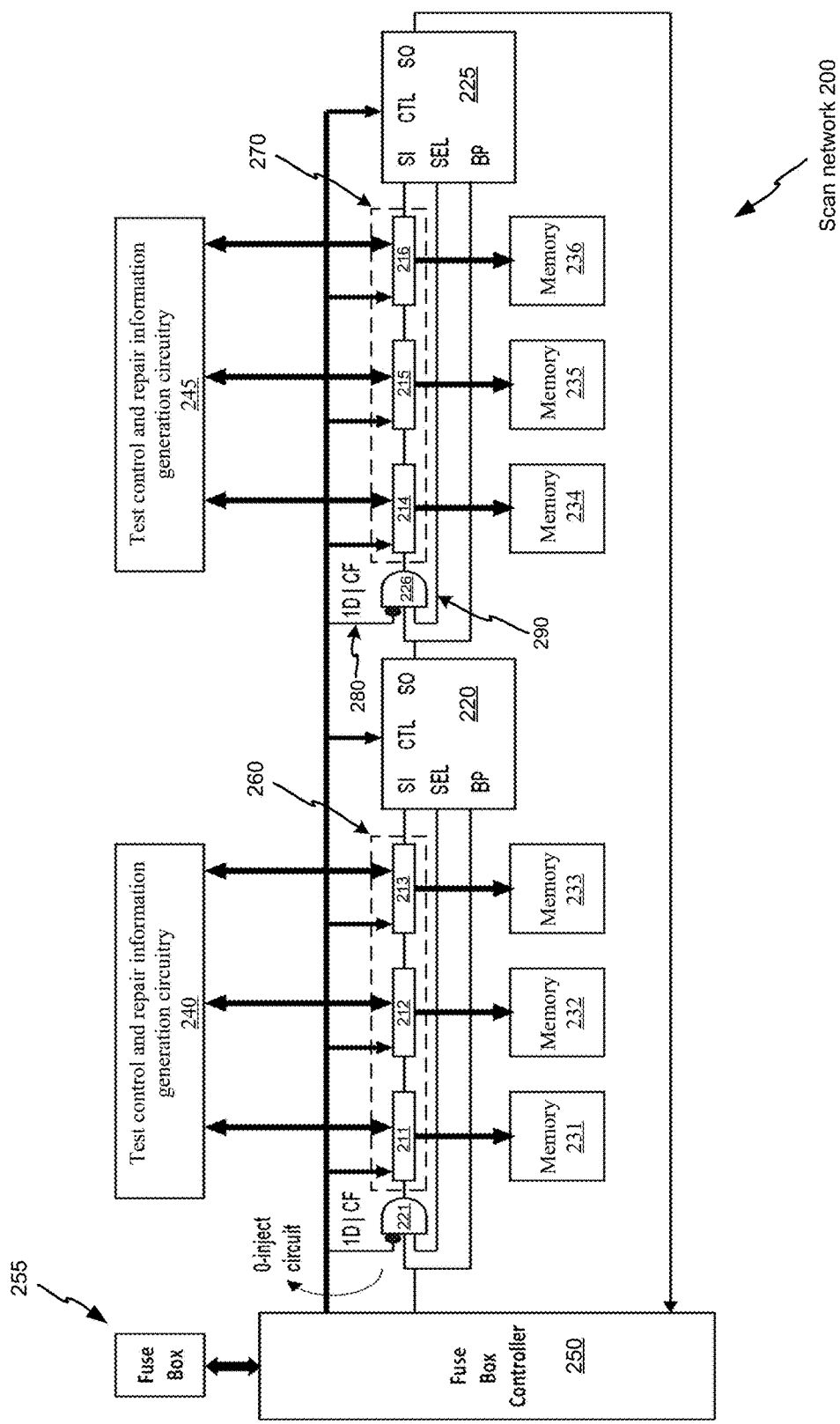
FIG. 2 illustrates an example of a detailed block diagram of a scan network according to various embodiments of the disclosed technology.

FIG. 2 illustrates an example of a detailed block diagram of a scan network 200 according to various embodiments of the disclosed technology. The scan network 200 comprises six repair registers 211-216. The repair registers 211-216 can provide repair information to six memories 231-236 for memory repair, respectively. Test control and repair information generation circuitry 240 can perform tests on and generate repair information for the memories 231-233, and test control and repair information generation circuitry 245 can perform tests on and generate repair information for the memories 234-236. The generated repair information can be uploaded to the scan network 200 and be transported to a fuse box controller 250 for storing in a fuse box 255. Upon powering up the circuit, the scan network 200 can transport the stored repair information back to the repair registers 211-216. The repair registers 211-216 may then transfer the repair information back to the repair information generation circuitry 240 and 245 for incremental memory repair. While each of the repair information generation circuitry 240 and the repair information generation circuitry 245 is shown to be a single box, one or both of the repair information generation circuitry 240 and the repair information generation circuitry 245 may include multiple test controllers configured to test different memories.

The scan network 200 also comprises two segment selection devices, dividing the repair registers 211-216 into two repair register segments 260 and 270. The first segment selection device associated with the repair register segment 260 comprises an AND gate 221 and a selection control device 220, and the second segment selection device associated with the repair register segment 270 comprises an AND gate 226 and a selection control device 225. In some operational modes of the scan network 200, the AND gates 221 and 226 can serve as zero-injection devices for the repair register segments 260 and 270, respectively. The AND gate 226, for example, replaces the regular scan input signal to the repair register segment 270 with bits of "0" when one or both of two control signals 1D and CF 280 are activated (i.e., being at "1") and/or a SEL signal 290 is inactivated (i.e., being at "0"). The control signals 1D and CF 280, being ORed in the figure, are supplied by the fuse box controller 250, and the SEL signal 290 is generated by the selection control device 225. The relationship between the operational modes of the scan network 200 and control signals including the control signals 1D and CF 280 and some other control signals from the fuse box controller 250 along with the SEL signal 290 will be described in detail below.

Figure 3:
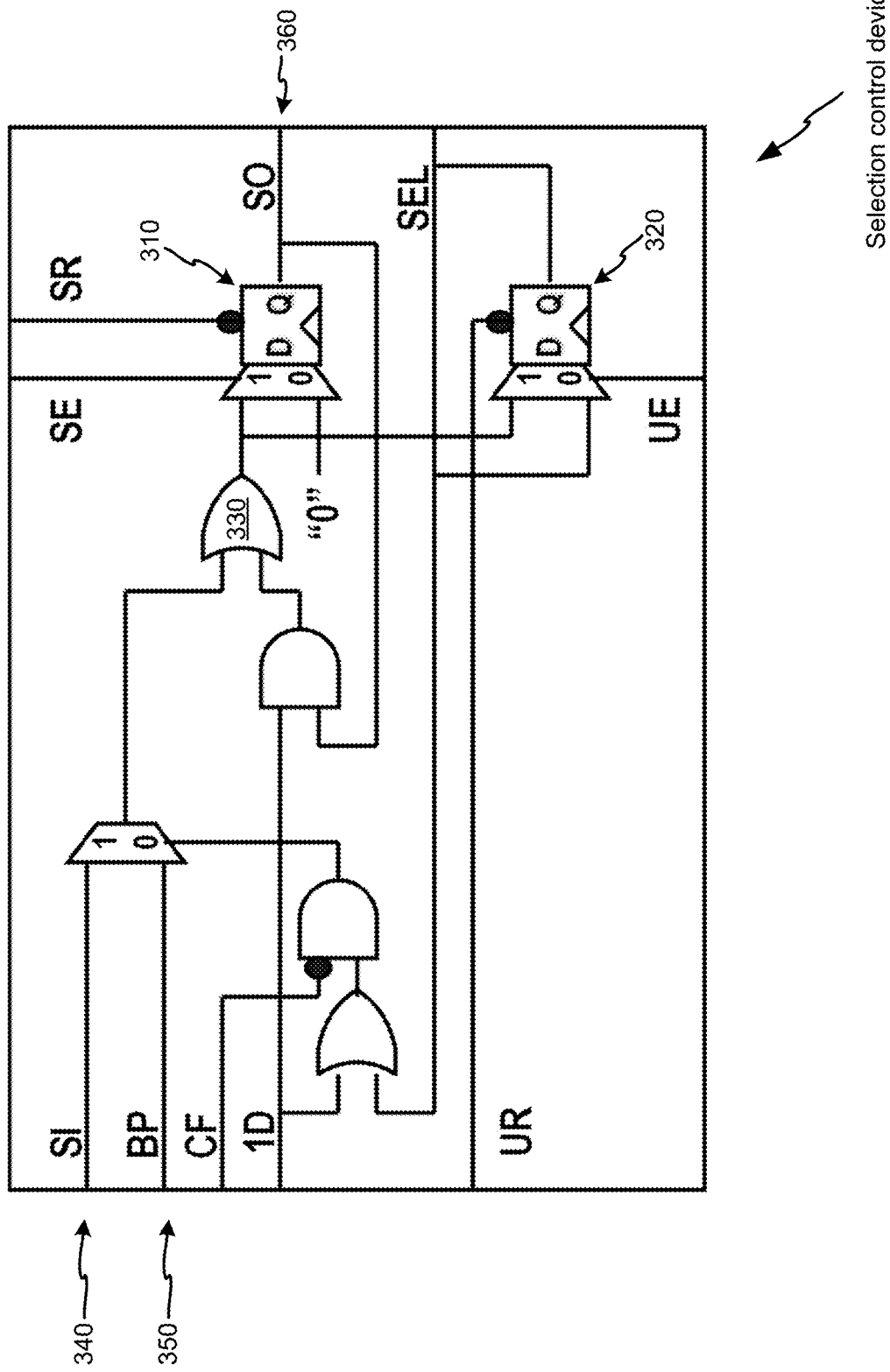
FIG. 3 illustrates an example of a block diagram for a selection control device which can be used to implement the selection control devices 220 and 225 in FIG. 2 according to various embodiments of the disclosed technology.

FIG. 3 illustrates an example of a block diagram for a selection control device 300 which can be used to implement the selection control devices 220 and 225 in FIG. 2 according to various embodiments of the disclosed technology. For illustration purposes, the selection control device 300 will be described with reference to the scan network 200. It should be noted that the selection control device 300 can be used in a scan network different from the scan network 200. The selection control device 300 comprises two flip-flops 310 and 320. The flip-flop 310 is a scan element on the scan path of the scan network 200. The flip-flop 310 is also configurable to perform a one-detection operation to generate the segment selection bit which will be discussed later. The flip-flop 320 can serve as the storage device for storing the segment selection bit. The selection control device 300 receives six control signals from the fuse box controller 250: SR, SE, UR, UE, 1D and CF. The control signals SR and UR are the reset signals for the flip-flops 310 and 320, respectively. 1D and CF are the same control signals as the control signals 1D and CF 280 in FIG. 2. Based on values of the control signals 1D and CF and a signal SEL outputted from the flip-flop 320, either a signal at an SI input 340 or a signal at a BP input 350 can be outputted at an SO output 360 of the selection control device 300. Here, the SI input 340 is coupled to the serial output of the repair register segment (e.g., the serial output of the repair register 216 in FIG. 2), and the BP input 350 is coupled to the serial input of the repair register segment (e.g., one input of AND gate 226 in FIG. 2).

The scan network 200 can operate in multiple modes/processes. For ease of understanding, these operational modes/processes that may be employed according to various embodiments of the disclosed technology will be described with reference to the scan network 200 in FIG. 2 including the selection control device 300 in FIG. 3 and the flow charts referred below. It should be appreciated, however, that alternate implementations of the scan network may be used to operate in these modes/processes illustrated by the flow charts according to various embodiments of the disclosed technology. Likewise, the scan network 200 may be employed to operate in other modes or perform other processes according to various embodiments of the disclosed technology. Further, while the operations for each of these modes or in each of the processes are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts typically do not show the various ways in which a particular model process can be combined with other mode(s)/process(es).

Figure 4:
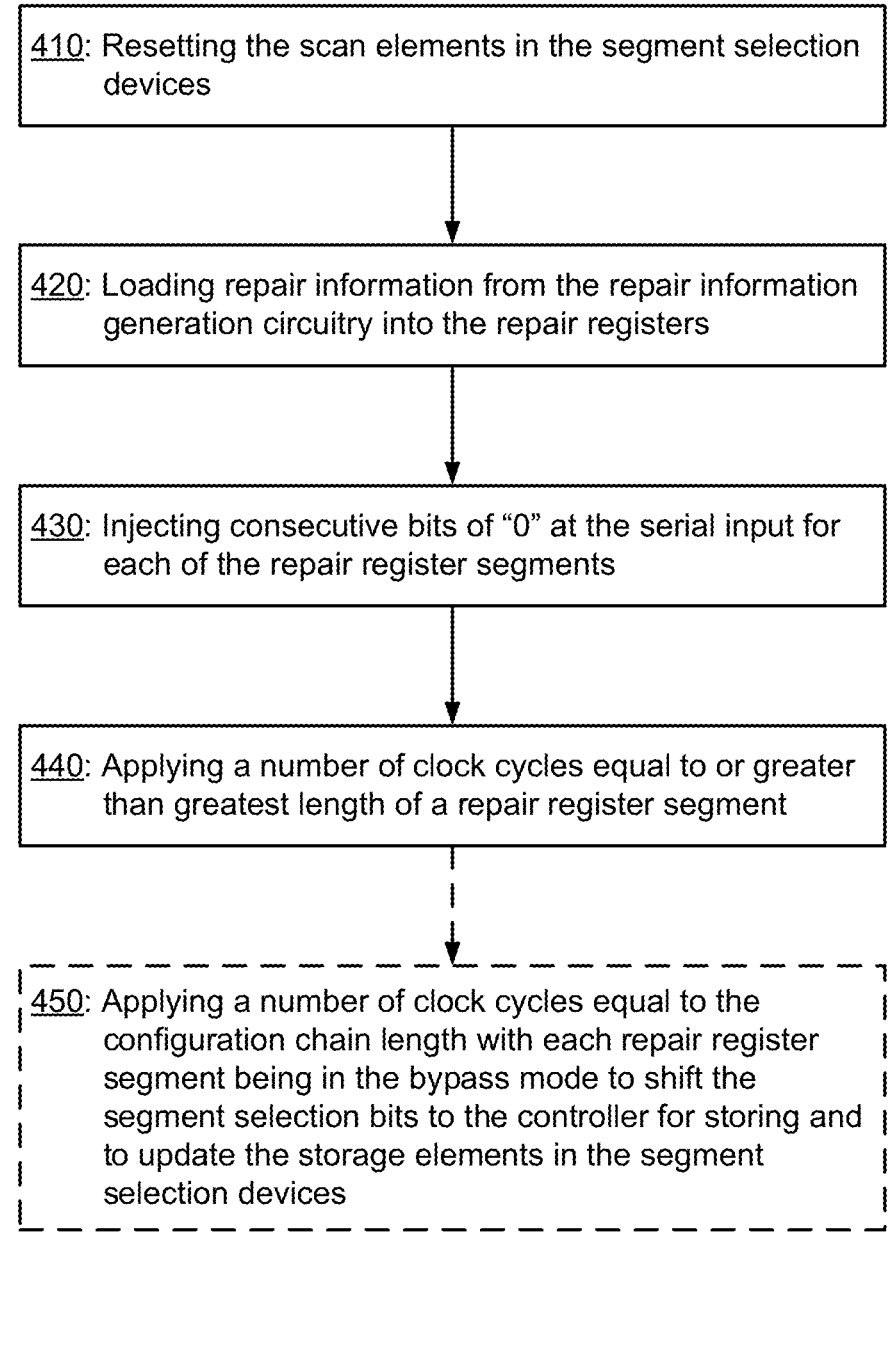
FIG. 4 illustrates a flow chart showing a process of one detection for generating segment selection bits that may be implemented according to various examples of the disclosed technology.

FIG. 4 illustrates a flow chart 400 showing a process of one detection for generating segment selection bits that may be implemented according to various examples of the disclosed technology. In operation 410, the scan elements in the segment selection devices (the selection control devices 220 and 225 in FIG. 2) are being reset. In the selection control device 300, the flip flop 310 is the scan element and as described below, is an important device for one detection. To prepare for one detection, the flip flop 310 can be reset by changing the control signal SR from "1" to "0" and then to "1". The control signal SR usually serves as the reset signal for other scan cells in the scan network 200 as well. For this type of circuits, all scan cells in the scan network 200 are being reset in the operation 410.

In operation, 420, the repair information is being loaded from the repair information generation circuitry into the repair registers in the scan network 200. The repair information can be generated by the repair information generation circuitry based on a memory test. The repair information for a particular memory will include bits of "1" if the memory test detects a defect in the memory or will have all zero bits if the memory test detects no defect in the memory. Typically, the repair information is loaded through the parallel inputs of the repair registers. In this operation, the control signals can be set as follows: SR=1, SE=0. The repair information is then loaded into the repair registers by applying a clock pulse. A value of 0 is also loaded into the flip-flop 310 at the same time. The values of other control signals (1D, CF, UR, UE) have no impact on the result of the operation.

In operations 430 and 440, consecutive bits of "0" are being injected at the serial input for each of the repair register segments 260 and 270 while a number of clock cycles equal to or greater than the greatest length of a repair register segment are applied to the scan network 200. The reason for the number of clock cycles applied to be preset at a number equal to or greater than the greatest length of a repair register segment in the scan network is to make sure that all of the bits in any of the repair register segments can be shifted into the corresponding selection control devices. In these operations, the control signals can be set as follows: UR=SR=1, UE=0, SE=1, 1D=1, CF=0. Because 1D=1 and CF=0, an OR gate 330 combines the input signal at the SI input 340 with the feedback signal from the SO output 360 into an input signal for the flip flop 310 in the selection control device 300. If any of the repair registers in the repair register segment stores at least a bit of "1" (meaning that the associated memory is defective and needs repair), the bit in the flip flop 310 will change from the original "0" to "1" when the first bit of "1" appears at the SI input 340. The flip flop 310 will retain the bit of "1" no matter what the following bits at the SI input 340 are. If bits in each of the repair registers are all zeros, the flip flop 310 will keep the original bit of "0". After the preset number of clock cycles, the final bit value in the flip flop 310 can indicate whether or not at least one of the memories associated with the repair registers in the repair register segment has a defect, serving as the segment selection bit for the repair register segment. Accordingly, the flip flop 310 along with the OR gate 330 can function as a one-detection device to generate the segment selection bit.

Also because 1D=1 and CF=0, the two AND gates 221 and 226 function as two zero-injection devices, injecting consecutive bits of "0" into the repair register segments 260 and 270, respectively. This can prevent bits from a repair register segment from entering a downstream neighboring repair register segment since the preset number of clock cycles may be greater than the lengths of some of the repair register segments.

Optionally, in operation 450, a number of clock cycles equal to the configuration chain length are applied to the scan network 200 with each repair register segment being in the bypass mode to shift the segment selection bits to the fuse box controller 250 for storing and to update the storage elements in the segment selection devices. The configuration chain length can be obtained in another process discussed below. In the operation, the control signals can be set as follows: UR=SR=1, UE=SE=1, 1D=0, CF=1. This condition ensures that all of the repair register segments are in the bypass mode because for the selection control device 300, the signal at the BP input 350 rather than the SI input 340 is being selected to propagate to the SO output 360. The flip flop 320, the storage element for storing the segment selection bit, is "updated" when the segment selection bit in the flip flop 310 is rotated back because UE=1.

Figure 5:
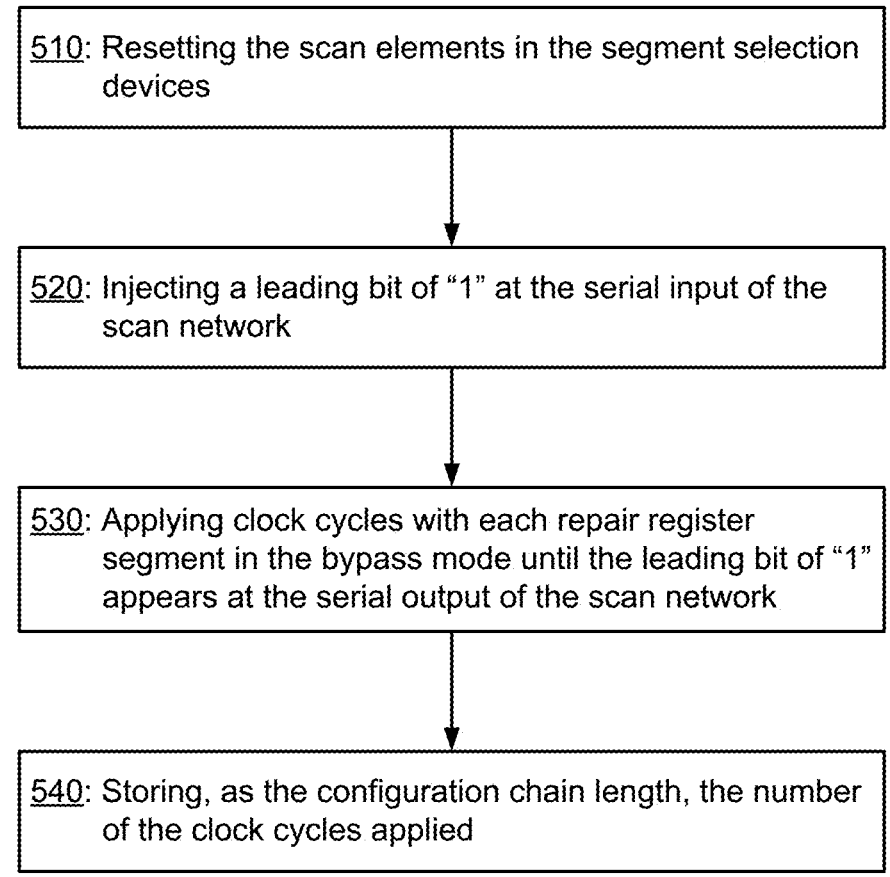
FIG. 5 illustrates a flow chart showing a process of configuration chain length determination that may be implemented according to various examples of the disclosed technology.

FIG. 5 illustrates a flow chart 500 showing a process of configuration chain length determination that may be implemented according to various examples of the disclosed technology. The configuration chain is a scan chain resulted from the scan network by bypassing all of the repair register segments. The scan cells on the configuration chain are essentially the scan elements in the segment selection devices. In the case of scan network 200, the configuration chain are formed by the two flip flops in the selection control devices 220 and 225, respectively, each corresponding to the flip flop 310 in the selection control device 300.

In operation 510, the scan elements in the segment selection devices (the flip flops on the scan path in the selection control devices 220 and 225) are being reset. This can be accomplished by changing the control signal SR from "1" to "0" and then to "1".

In operations 520 and 530, a leading bit of "1" and other following bits are being injected at the serial input for the scan network 200 while clock cycles are applied to the scan network 200 with each repair register segment being in the bypass mode until the leading bit of "1" appears at the serial output of the scan network. The "other following bits" may be the segment selection bits that the fuse box controller 250 derives based on the data stored in the fuse box 255. When a repair register segment is in the bypass mode, the repair registers in the repair register segment are not on the scan path. In the corresponding selection control device, the signal at the BP input 350 is delivered to the SO output 360. In these operations, the control signals can be set as follows: UR=SR=1, UE=SE=1, 1D=0, CF=1, the same as in the operation 450 in the flow chart 400.

In operation 540, the fuse box controller 250 stores the number of the clock cycles applied in the fuse box 255 as the configuration chain length.

Figure 6:
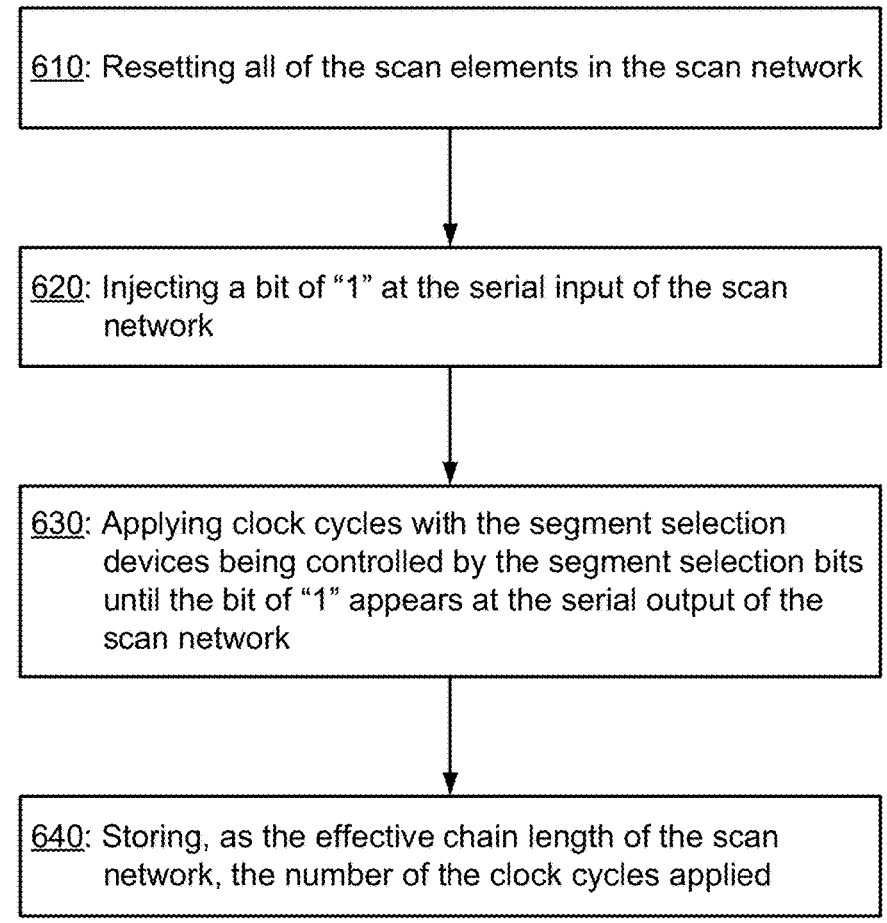
FIG. 6 illustrates a flowchart showing a process of effective chain length determination that may be implemented according to various examples of the disclosed technology.

FIG. 6 illustrates a flow chart 600 showing a process of effective chain length determination that may be implemented according to various examples of the disclosed technology. The effective chain length is equal to the total number of scan cells in the repair register segments where one or more memories need repair plus the total number of scan elements in all of the segment selection devices.

In operation 610, all of the scan cells in the repair register segments where one or more memories need repair and all of the scan elements in the segment selection devices are being reset. This can be accomplished by changing the control signal SR from "1" to "0" and then to "1".

In operations 620 and 630, a leading bit of "1" and other following bits are being injected at the serial input for the scan network 200 while clock cycles are applied to the scan network 200 with the segment selection devices being controlled by the segment selection bits until the leading bit of "1" appears at the serial output of the scan network. Here, the "other following bits" may be the bits of the repair information that the fuse box controller 250 derives based on the data stored in the fuse box 255. In these operations, the control signals can be set as follows: UR=SR=1, UE=0, SE=1, 1D=CF=0. When 1D=CF=0 in the selection control device 300, whether the signal at the BP input 350 or the SI input 340 is dependent on the SEL signal (the segment selection bit stored in the flip flop 320). Thus, all of the segment selection bits should be stored in the storage element in each of the segment selection devices before the operations 620 and 630.

In operation 640, the fuse box controller 250 stores the number of the clock cycles applied in the fuse box 255 as the effective chain length.

Figure 7:
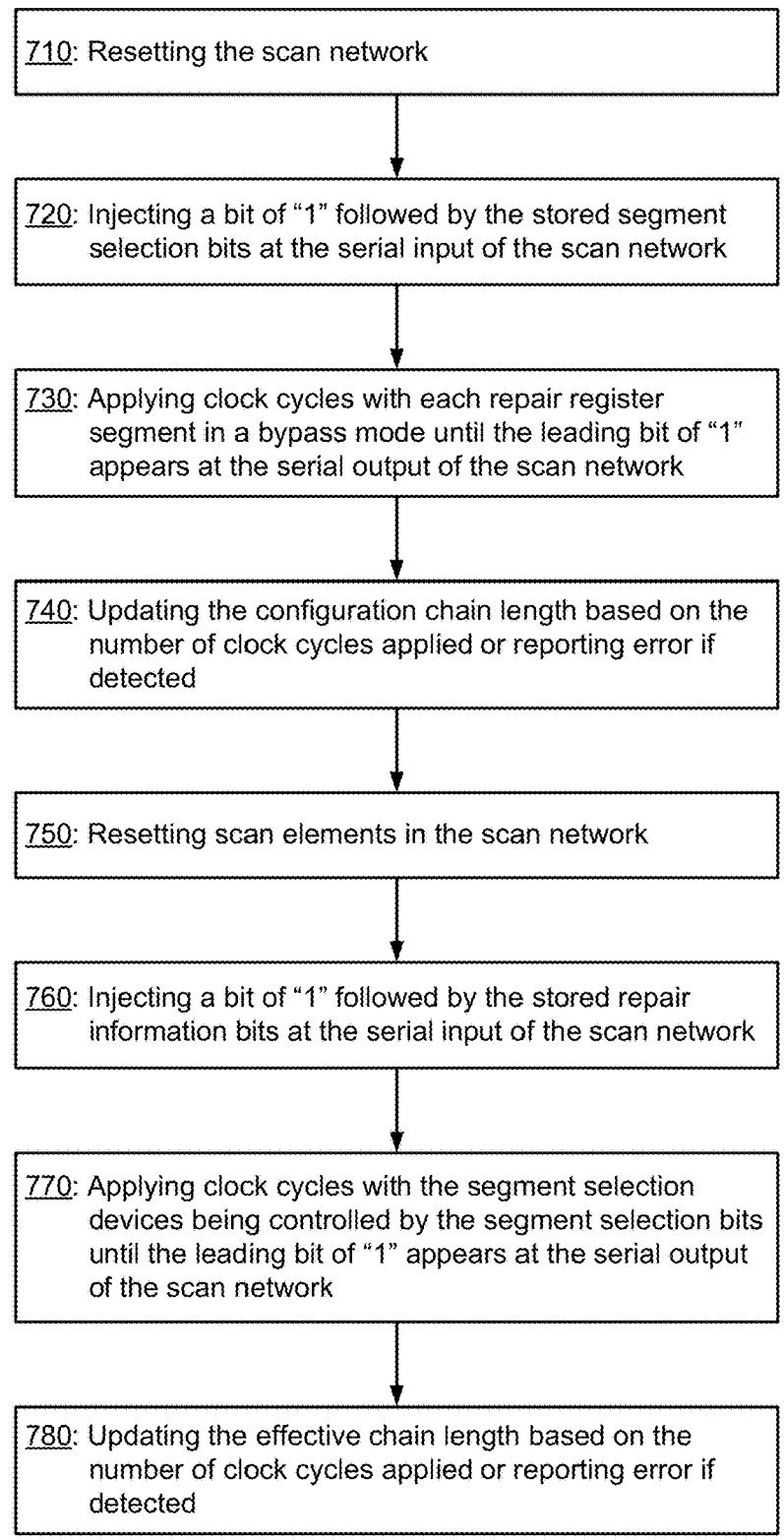
FIG. 7 illustrates a flow chart showing a power-up process that may be implemented according to various examples of the disclosed technology.

FIG. 7 illustrates a flow chart 700 showing a power-up process that may be implemented according to various examples of the disclosed technology. The power-up process can check the configuration chain length and the effective chain length while loading the segment selection bits into the segment selection devices and the repair information bits into the repair registers in the repair register segments where one or more memories need repair, respectively.

In operation 710, the scan network is being reset. This can be accomplished by changing both the control signals SR and UR from "X" to "0" and then to "1". Upon powering up the circuit, the control signals SR and UR may be in arbitrary states and thus their values are represented by "X".

In operations 720 and 730, a leading bit of "1" followed by the segment selection bits that the fuse box controller 250 derives based on the data stored in the fuse box 255 is injected at the serial input for the scan network 200 while clock cycles are applied to the scan network 200 with each repair register segment being in the bypass mode until the leading bit of "1" appears at the serial output of the scan network. These operations are similar to the operations 520 and 530, thus the control signals can be set as follows: UR=SR=1, UE=SE=1, 1D=0, CF=1. After these two operations, not only the configuration chain length is determined but the segment selection bits are loaded into the segment selection devices. In the case of the selection control device 300, both the flip flops 310 and 320 (the scan element and the storage element) are updated with the segment selection bit.

In operation 740, the controller 250 updates the configuration chain length based on the number of clock cycles applied. The updating may comprise storing it in the fuse box 255. The controller 250 can report an error if detected. The error may include that the leading "1" never appears at the serial output of the scan network within a preset period of time or the derived configuration chain length is different from the stored one.

In operation 750, the scan elements in the scan network is being reset. The scan elements comprise scan elements in the selection control devices like the scan element 310 in the selection control device 300. This can be accomplished by changing the control signal SR from "1" to "0" and then to "1".

In operations 760 and 770, a leading bit of "1" followed by bits of the repair information that the fuse box controller 250 derives based on the data stored in the fuse box 255 are being injected at the serial input for the scan network 200 while clock cycles are applied to the scan network 200 with the segment selection devices being controlled by the segment selection bits until the leading bit of "1" appears at the serial output of the scan network. These operations are similar to the operations 620 and 630, thus the control signals can be set as follows: UR=SR=1, UE=0, SE=1, 1D=CF=0. After these two operations, not only the effective chain length is derived but the repair information bits are loaded into the repair registers in the repair register segments where one or more memories need repair.

In operation 780, the controller 250 updates the effective chain length based on the number of clock cycles applied. The updating may comprise storing it in the fuse box 255. The controller 250 can report an error if detected. The error may include that the leading "1" never appears at the serial output of the scan network with a preset period of time or the derived effective chain length is different from the stored one.

Figure 8:
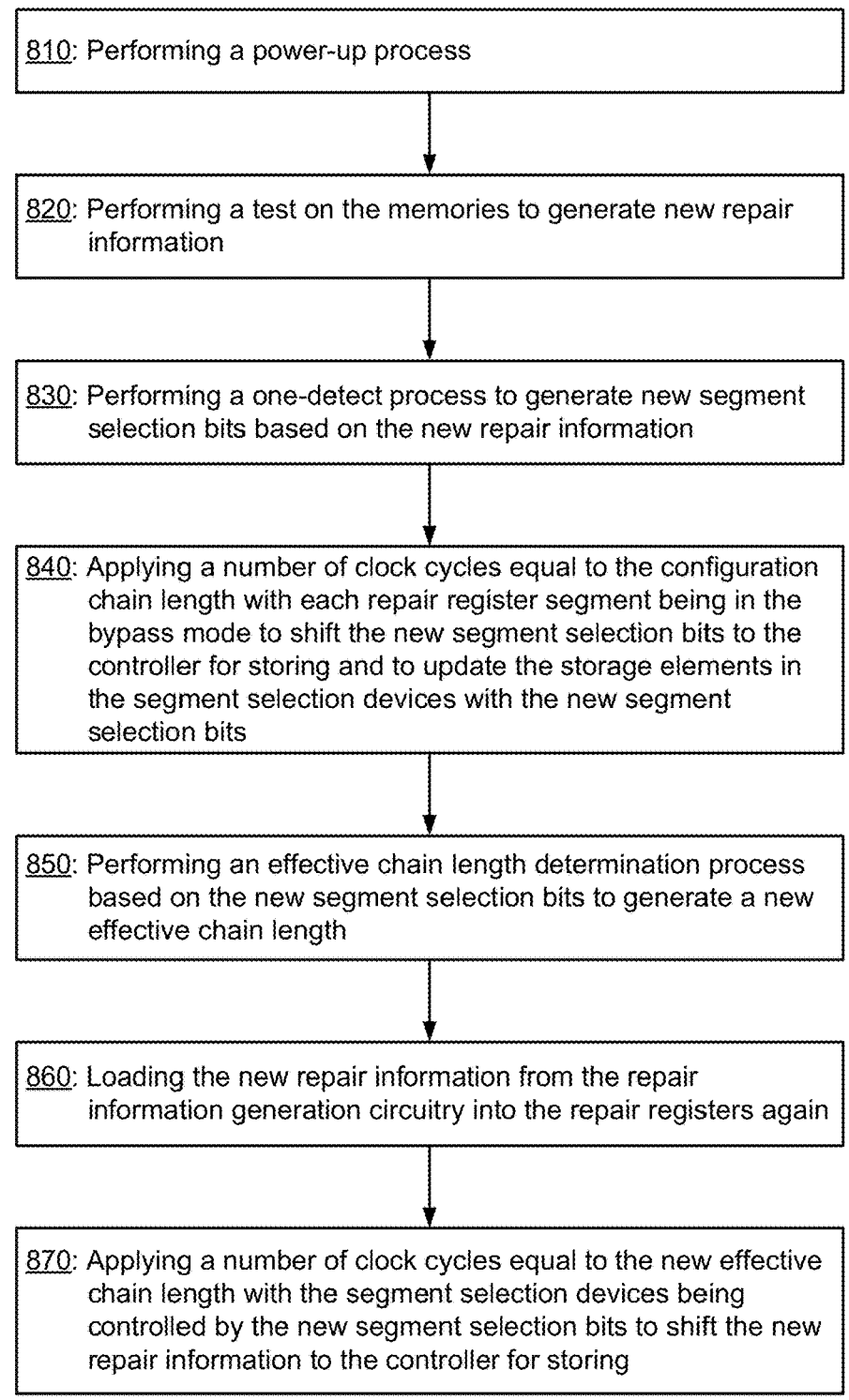
FIG. 8 illustrates a flow chart showing a programming process that may be implemented according to various examples of the disclosed technology.

FIG. 8 illustrates a flow chart 800 showing a programming process that may be implemented according to various examples of the disclosed technology. In operation 810, a power-up process is performed. The power-up process can be implemented using the one illustrated by the flow chart 700 in FIG. 7. In operation 820, a test is performed on the memories to generate new repair information. In operation 830, a one-detection process is performed to generate new segment selection bits based on the new repair information. The one-detection process can be implemented using the one illustrated by the flow chart 400 in FIG. 4. The optional operation 450 does not need to be included here because it is the same as the next operation. In operation 840, a number of clock cycles equal to the configuration chain length are applied to the scan network with each repair register segment being in the bypass mode to shift the new segment selection bits to the fuse box controller 250 for storing and to update the storage elements in the segment selection devices with the new segment selection bits. In this operation, the control signals can be set as follows: UR=SR=1, UE=SE=1, 1D=0, CF=1.

In operation 850, an effective chain length determination process is performed based on the new segment selection bits to generate a new effective chain length. After the test performed in the operation 820, a new defect may be found in a memory associated with a repair register segment where no memory needed repair before the test and for which the segment selection bit was set to "0". As such, this repair register segment should not be bypassed and thus the previous effective chain length cannot be used. The effective chain length determination process can be implemented using the one illustrated by the flow chart 600 in FIG. 6.

In operation 860, the new repair information is loaded from the repair information generation circuitry into the repair registers again. In this operation, the control signals can be set as follows: SR=1, SE=0. The repair information is then loaded into the repair registers by applying a clock pulse. A value of 0 is also loaded into the flip-flop 310 at the same time. The values of other control signals (1D, CF, UR, UE) have no impact on the result of the operation.

In operation 870, a number of clock cycles equal to the new effective chain length are applied to the scan network with the segment selection devices being controlled by the new segment selection bits to shift the new repair information to the fuse box controller 250 for storing in the fuse box 255. The new repair information is also shifted back to the repair registers at the end of the operation. In this operation, the control signals can be set as follows: UR=SR=1, UE=0, SE=1, 1D=0, CF=0.

Figure 9:
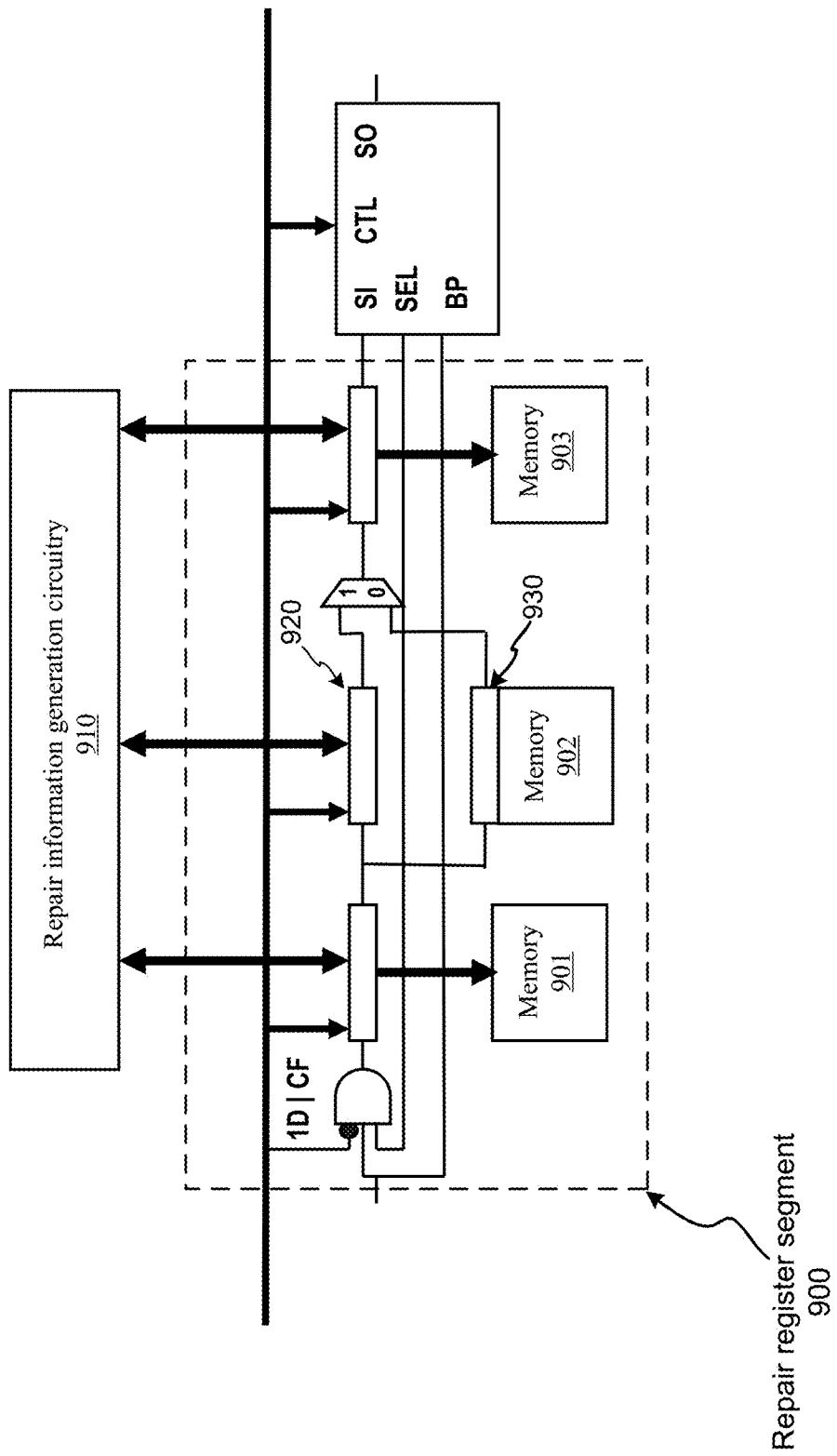
FIG. 9 illustrates an example of a repair register segment in which bits of the repair information for a memory is shifted into a register before being applied to the memory according to some embodiments of the disclosed technology.

In some circuits, bits of the repair information are shifted into a register and then are applied to the memory. FIG. 9 illustrates an example of a repair register segment 900 in which bits of the repair information for a memory 902 are first transferred from the repair information generation circuitry 910 to a repair register 920 in parallel and then are shifted into another register 930 before being applied to the memory 902 according to some embodiments of the disclosed technology. The shifting of bits of the repair information from the repair register 920 to the register 930 is accomplished by rotating the scan network. In this example, the repair information for memories 901 and 903 are directly applied from repair registers 940 and 950, respectively, similar to how the repair information is applied to the memories 231-236 in FIG. 2.

Figure 10:
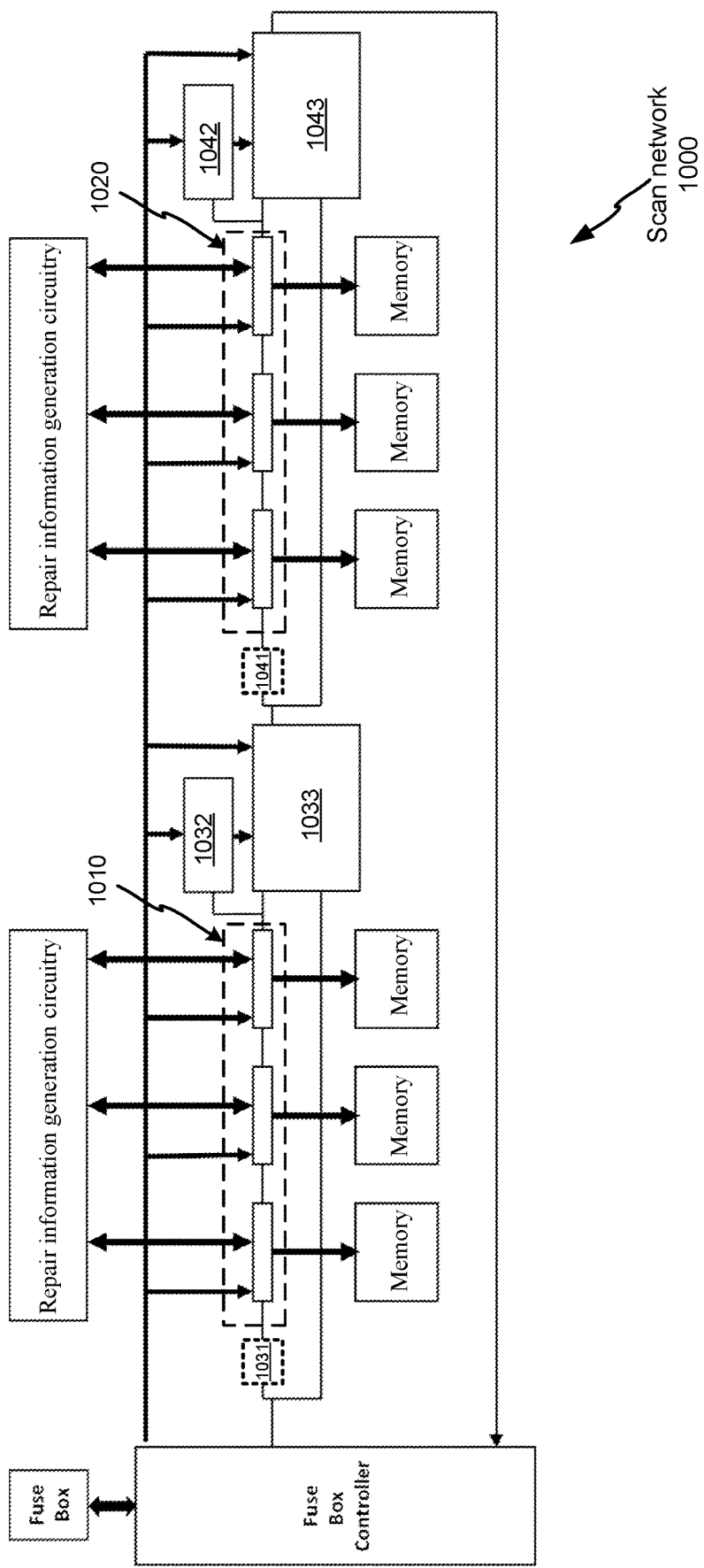
FIG. 10 illustrates an example of a block diagram of a scan network in which one-detection devices are not on the scan path of the scan network according to various embodiments of the disclosed technology.

As FIG. 3 illustrated, the flip flop 310 and the OR gate 330 can be configured to serve as a one-detection device to generate the segment selection bit. Such a one-detection device is on the scan path of the scan network because a signal at the SI input 340 or the BP input 350 passes, during a shift operation, through the OR gate 330 and the flip flop 310 to reach the SO output 360. The one-detection device does not need to be on the scan path, however. FIG. 10 illustrates an example of a block diagram of a scan network 1000 in which one-detection devices are not on the scan path of the scan network 1000 according to various embodiments of the disclosed technology. The scan network 1000 comprises two segment selection devices associate with two repair register segments 1010 and 1020, respectively. The segment selection device associated with the repair register segment 1010 comprises a zero-injection device 1031, a one-detection device 1032, and a selection control device 1033. The segment selection device associated with the repair register segment 1020 comprises a zero-injection device 1041, a one-detection device 1042, and a selection control device 1043. Like the scan network 200 in FIG. 2, the zero-injection devices 1031 and 1041 can be implemented with an AND gate.

The zero-injection devices 1031 and 1041 are optional devices. According to some embodiments of the disclosed technology, a scan network like the scan network 1000 can include a zero-injection device in front of each of the repair register segments and operate in processes similar to the scan network 200 in FIG. 2. According to some other embodiments of the disclosed technology, a scan network like the scan network 1000 can include only one zero-injection device placed before the first repair register segment like the repair register segment 1010 or no zero-injection device. In a one-detection process, each selection control device is configured to operate in a bypass mode while each one-detection device is configured to determine whether the repair information for the associated repair register segment contains at least a bit of "1". In the case of no zero-injection device, the controller can be configured to inject bits of "0" into the scan network.

Figure 11:
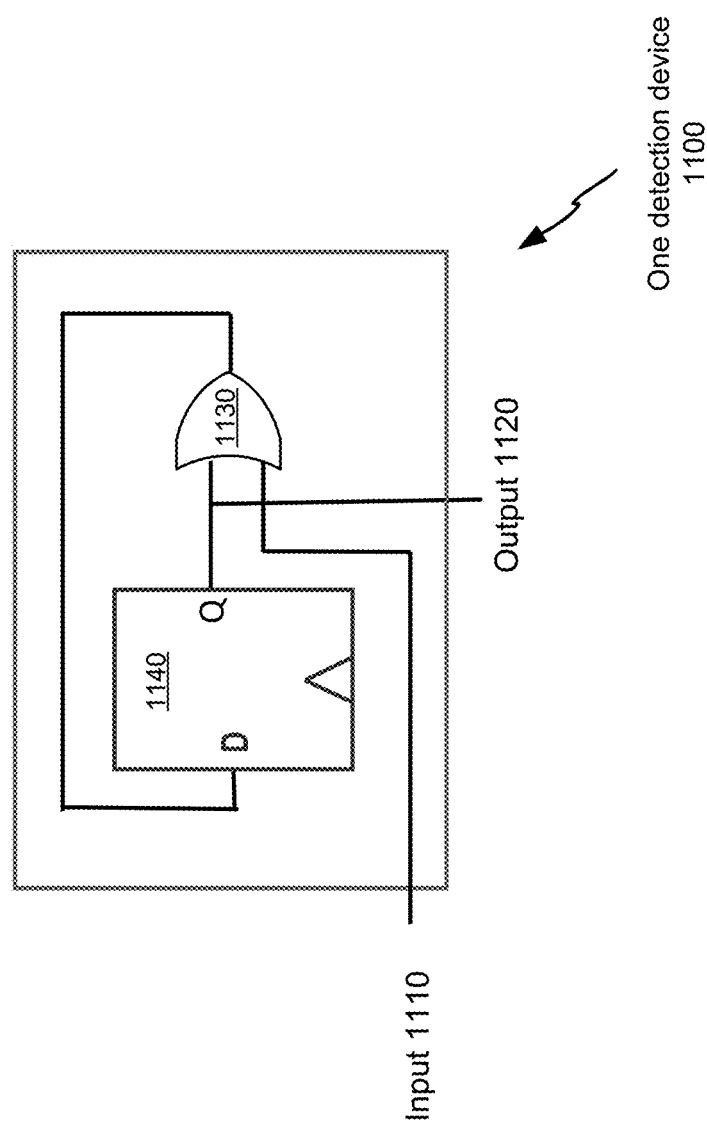
FIG. 11 illustrates an example of a block diagram of a one-detection device with which the one-detection devices 1032 and 1042 in FIG. 10 can be implemented according to various embodiments of the disclosed technology.

FIG. 11 illustrated an example of a block diagram of a one-detection device 1100 with which the one-detection devices 1032 and 1042 in FIG. 10 can be implemented according to various embodiments of the disclosed technology. Like the one-detection device in FIG. 3, the one-detection device 1100 comprises a flip flop 1140 and an OR gate 1130. One input of the OR gate 1130 is an input 1110 of the one-detection device 1100, which can be coupled to a serial output of a repair register segment. The other input of the OR gate 1130 is coupled to the output of the flip flop 1140. The output of the flip flop 1140 also serves as the output of the one-detection device 1100.

Figure 12:
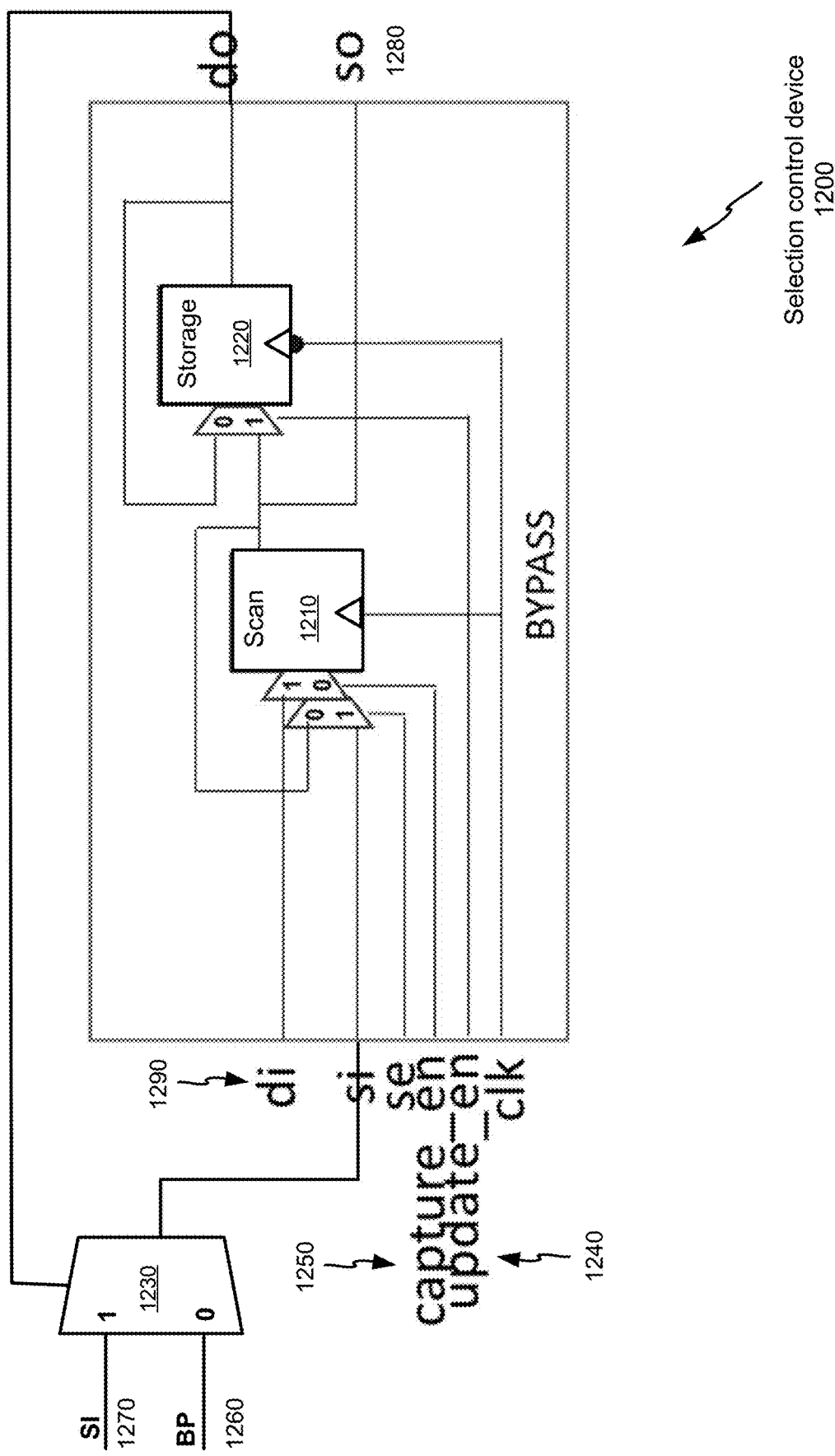
FIG. 12 illustrates an example of a block diagram of a selection control device with which the selection control device 1033 and 1043 in FIG. 10 can be implemented according to various embodiments of the disclosed technology.

FIG. 12 illustrated an example of a block diagram of a selection control device 1200 with which the selection control device 1033 and 1043 in FIG. 10 can be implemented according to various embodiments of the disclosed technology. The selection control device 1200 comprises two flip flops 1210 and 1220. The flip flop 1210 is a scan element through which a signal at either an SI input 1270 (not bypassing the repair register segment) or a BP input 1260 (bypassing the repair register segment) can reach an SO output 1280. The flip flop 1210 can also capture the output signal from a one-detection device (the segment selection bit) at a di input 1290 when a capture_en signal 1250 is asserted. The flip flop 1220 is a storage element for storing the segment selection bit. The output of the flip flop 1220 controls a multiplexer 1230, determining at which input, the SI input 1270 or the BP input 1260, a signal will be allowed to enter the selection control device 1200. When an update_en signal 1240 is asserted, the flip flop 1220 updates its content.

Figure 13:
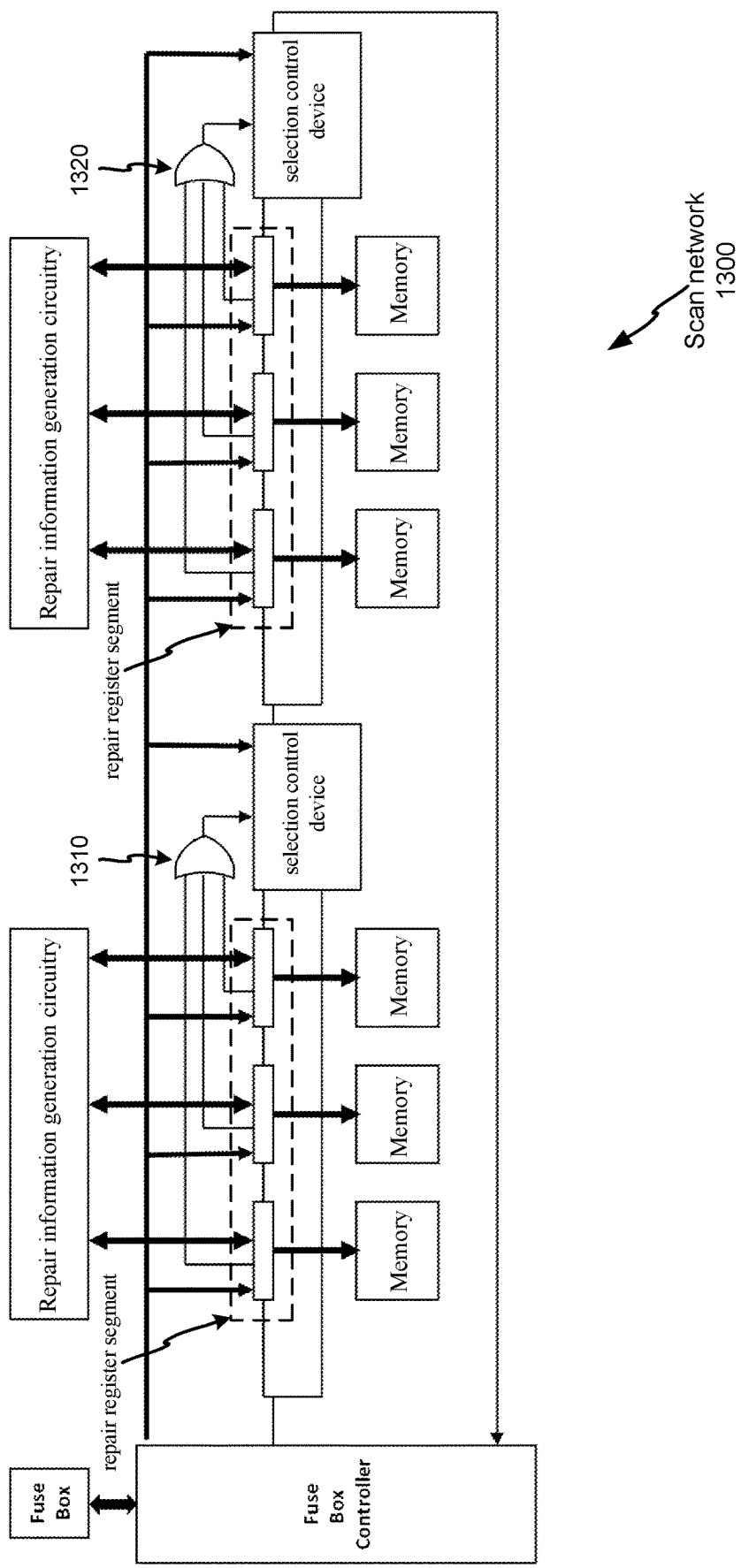
FIG. 13 illustrates an example of a block diagram of a scan network in which the segment selection devices do not comprise one-detection devices according to various embodiments of the disclosed technology.

FIG. 13 illustrates an example of a block diagram of a scan network 1300 in which the segment selection devices do not comprise one-detection devices according to various embodiments of the disclosed technology. In the scan network 1300, OR gates 1310 and 1320 replace the one-detection devices 1032 and 1042 in FIG. 10 to serve as the segment selection bit generation circuitry for the segment selection devices. In some memory designs, a particular bit of the repair information is set to be "0" if the memory does not need repair and "1" if the memory needs repair. These particular bits of the repair registers serve as input signals for the OR gates 1310 and 1320. Some other memory designs do not employ such a particular bit of the repair information to indicate the repair status. In this case, an OR gate can be used to combine bits of a repair register into a single bit which can then be combined with other bits from other repair register by another OR gate.

Figure 14:
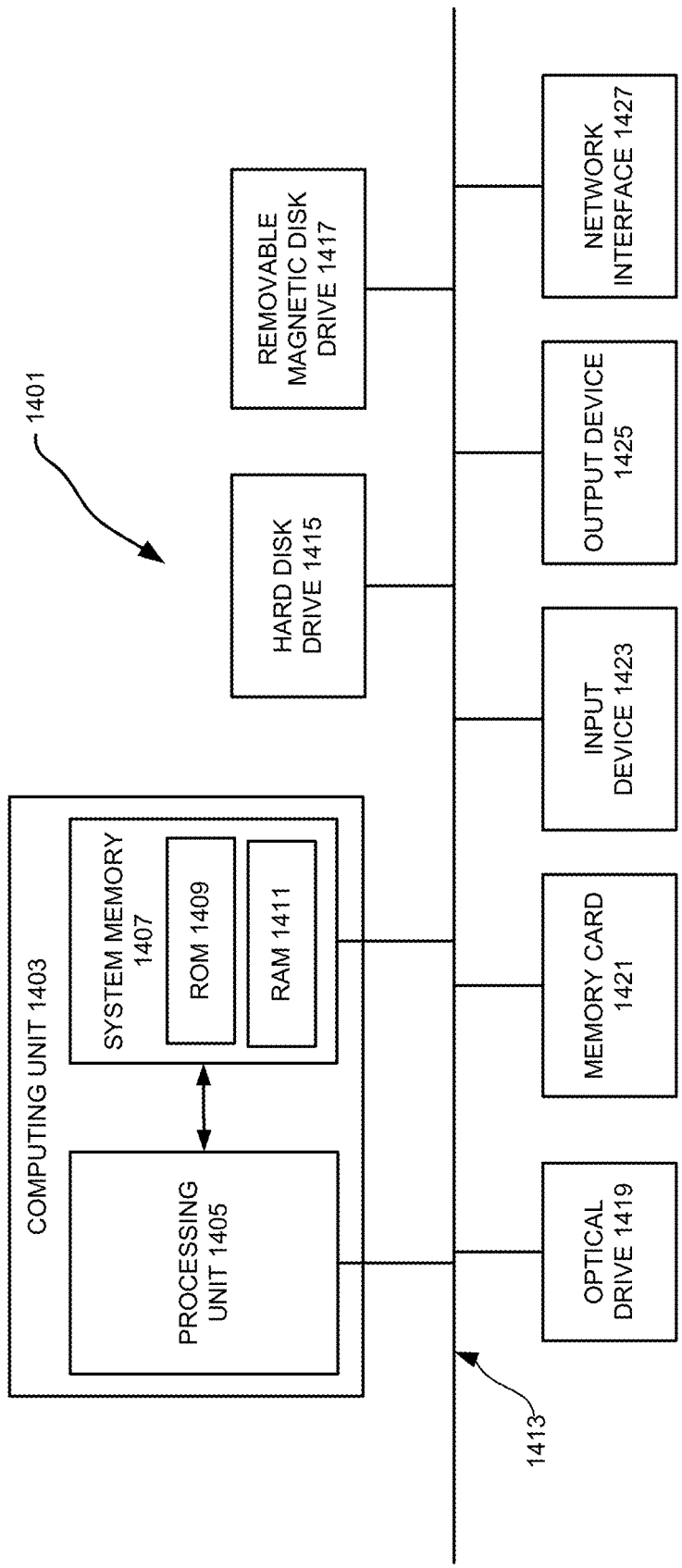
FIG. 14 illustrates a programmable computer system with which various embodiments of the disclosed technology may be employed.

Various examples of the disclosed technology may be implemented through the execution of software instructions by a computing device, such as a programmable computer. Accordingly, FIG. 14 shows an illustrative example of a computing device 1401. As seen in this figure, the computing device 1401 includes a computing unit 1403 with a processing unit 1405 and a system memory 1407. The processing unit 1405 may be any type of programmable electronic device for executing software instructions, but it will conventionally be a microprocessor. The system memory 1407 may include both a read-only memory (ROM) 1409 and a random access memory (RAM) 1411. As will be appreciated by those of ordinary skill in the art, both the read-only memory (ROM) 1409 and the random access memory (RAM) 1411 may store software instructions for execution by the processing unit 1405.

The processing unit 1405 and the system memory 1407 are connected, either directly or indirectly, through a bus 1413 or alternate communication structure, to one or more peripheral devices. For example, the processing unit 1405 or the system memory 1407 may be directly or indirectly connected to one or more additional memory storage devices, such as a "hard" magnetic disk drive 1415, a removable magnetic disk drive 1417, an optical disk drive 1419, or a flash memory card 1421. The processing unit 1405 and the system memory 1407 also may be directly or indirectly connected to one or more input devices 1423 and one or more output devices 1425. The input devices 1423 may include, for example, a keyboard, a pointing device (such as a mouse, touchpad, stylus, trackball, or joystick), a scanner, a camera, and a microphone. The output devices 1425 may include, for example, a monitor display, a printer and speakers. With various examples of the computer 1401, one or more of the peripheral devices 1415-1425 may be internally housed with the computing unit 1403. Alternately, one or more of the peripheral devices 1415-1425 may be external to the housing for the computing unit 1403 and connected to the bus 1413 through, for example, a Universal Serial Bus (USB) connection.

With some implementations, the computing unit 1403 may be directly or indirectly connected to one or more network interfaces 1427 for communicating with other devices making up a network. The network interface 1427 translates data and control signals from the computing unit 1403 into network messages according to one or more communication protocols, such as the transmission control protocol (TCP) and the Internet protocol (IP). Also, the interface 1427 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 1401 is illustrated as an example only, and it is not intended to be limiting. Various embodiments of the disclosed technology may be implemented using one or more computing devices that include the components of the computer 1401 illustrated in FIG. 14, which include only a subset of the components illustrated in FIG. 14, or which include an alternate combination of components, including components that are not shown in FIG. 14. For example, various embodiments of the disclosed technology may be implemented using a multi-processor computer, a plurality of single and/or multiprocessor computers arranged into a network, or some combination of both.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A scan network in a circuit configured to transport repair information independently or along with one or more other networks between a plurality of memories and a controller for a non-volatile storage device, comprising:
   a plurality of repair registers, each of the plurality of repair registers comprising one or more scan cells which are coupled in parallel to repair information generation circuitry for one of the plurality of memories; and
   a plurality of segment selection devices, the plurality of segment selection devices dividing the plurality of repair registers into a plurality of repair register segments, each of the plurality of segment selection devices comprising:
      a storage element configured to store a segment selection bit, and
      segment selection bit generation circuitry configured to generate the segment selection bit based on the repair information generated by the repair information generation circuitry coupled to repair registers in one of the plurality of repair register segments for which the segment selection bit is generated,
   wherein the each of the plurality of segment selection devices is configurable to include or not include the one of the plurality of repair register segments in a scan path of the scan network in a shift operation based on the segment selection bit.

2. The scan network recited in claim 1, wherein at least one repair register segment in the plurality of repair register segments comprises more than one repair registers.

3. The scan network recited in claim 1, wherein the plurality of segment selection devices dividing the plurality of repair registers into the plurality of repair register segments employs an algorithm for achieving an objective of a number of scan cells in each of the plurality of repair register segments being close to a number derived by dividing a total number of scan cells in the plurality of repair register segments by a total number of the plurality of repair register segments.

4. The scan network recited in claim 3, wherein the total number of the plurality of repair register segments is derived by computing a square root of one half of a product of the number of scan cells in the plurality of repair register segments and a number of repair register segments estimated to be included on the scan path, the number of repair register segments estimated to be included on the scan path being an estimated number of repair register segments in which memories have defects.

5. The scan network recited in claim 1, wherein the segment selection bit generation circuitry comprises a one-detection device configurable to generate the segment selection bit.

6. The scan network recited in claim 5, wherein the one-detection device comprises a storage element on the scan path, and each of the plurality of segment selection devices further comprises a zero-injection device with an output coupled to a serial input of the one of the plurality of repair register segments, the zero-injection device configurable to output a constant "0" during a process for generating the segment selection bit.

7. The scan network recited in claim 5, wherein the one-detection device comprises a storage element outside the scan path.

8. The scan network recited in claim 1, wherein the controller for the non-volatile storage device is configurable to enable the scan network to perform a one-detection process, the one-detection process comprises:
   loading the repair information from the repair information generation circuitry into the plurality of repair registers;
   injecting bits of "0" continuously at a serial input of each of the plurality of repair register segments; and
   applying a number of clock cycles equal to or greater than greatest length of a repair register segment within the plurality of repair register segments, length of a particular repair register segment being equal to a total number of scan cells in repair registers in the particular repair register segment.

9. The scan network recited in claim 1, wherein the controller for the non-volatile storage device is configurable to enable the scan network to perform a process of configuration chain length determination, the process of configuration chain length determination comprises:
injecting a leading bit of "1" at a serial input of the scan network;
applying clock cycles to the scan network with each of the plurality of repair register segment being in a bypass mode until the leading bit of "1" appears at a serial output of the scan network; and
storing a number of the clock cycles applied as configuration chain length.

10. The scan network recited in claim 1, wherein the controller for the non-volatile storage device is configurable to enable the scan network to perform a process of effective chain length determination, the process of effective chain length determination comprises:
injecting a leading bit of "1" at a serial input of the scan network;
applying a number of clock cycles to the scan network with each of the plurality of segment selection devices being controlled by the segment selection bit until the leading bit of "1" appears at a serial output of the scan network; and
storing a number of the clock cycles applied as the effective chain length.

11. The scan network recited in claim 1, wherein the controller for the non-volatile storage device is configurable to enable the scan network to perform a power-up process, the power-up process comprises:
resetting the scan network;
injecting a leading bit of "1" followed by segment selection bits derived based on data stored in the non-volatile storage device at a serial input for the scan network;
applying first clock cycles to the scan network with each of the plurality of repair register segment being in a bypass mode until the leading bit of "1" appears at a serial output of the scan network;
updating configuration chain length based on a number of first clock cycles applied or reporting error if detected;
resetting scan elements in the scan network;
injecting a leading bit of "1" followed by bits of the repair information derived based on data stored in the non-volatile storage device at the serial input for the scan network;
applying second clock cycles to the scan network with each of the plurality of segment selection devices being controlled by the segment selection bit until the leading bit of "1" appears at the serial output of the scan network; and
updating effective chain length based on a number of second clock cycles applied or reporting error if detected.

12. The scan network recited in claim 1, wherein the controller for the non-volatile storage device is configurable to enable the scan network to operate in a programming process, the programming process comprises:
performing a power-up process;
performing a test on the plurality of memories to generate new repair information;
performing a one-detection process to generate new segment selection bits based on the new repair information;
applying a number of clock cycles equal to configuration chain length to the scan network with each of the plurality of repair register segments being in a bypass mode to shift the new segment selection bits to the controller for the non-volatile storage device for storing and to update the storage element in each of the plurality of segment selection devices with the new segment selection bits;
performing a process of effective chain length determination based on the new segment selection bits to generate a new effective chain length;
loading the new repair information from the repair information generation circuitry into the plurality of repair registers; and
applying a number of clock cycles equal to the new effective chain length to the scan network with the segment selection devices being controlled by the new segment selection bits to shift the new repair information to the controller for the non-volatile storage device for storing.

13. One or more non-transitory computer-readable media storing computer-executable instructions for causing a computer to perform a method, the method comprising:
creating, in a circuit design, a scan network configured to transport repair information independently or along with one or more other networks between a plurality of memories and a controller for a non-volatile storage device, the scan network comprising:
a plurality of repair registers, each of the plurality of repair registers comprising one or more scan cells which are coupled in parallel to repair information generation circuitry for one of the plurality of memories; and
a plurality of segment selection devices, the plurality of segment selection devices dividing the plurality of repair registers into a plurality of repair register segments, each of the plurality of segment selection devices comprising:
a storage element configured to store a segment selection bit, and
segment selection bit generation circuitry configured to generate the segment selection bit based on the repair information generated by the repair information generation circuitry coupled to repair registers in one of the plurality of repair register segments for which the segment selection bit is generated,
wherein the each of the plurality of segment selection devices is configurable to include or not include the one of the plurality of repair register segments in a scan path of the scan network in a shift operation based on the segment selection bit.

14. The one or more non-transitory computer-readable media recited in claim 13, wherein at least one repair register segment in the plurality of repair register segments comprises more than one repair registers.

15. The one or more non-transitory computer-readable media recited in claim 13, wherein the plurality of segment selection devices dividing the plurality of repair registers into the plurality of repair register segments employs an algorithm for achieving an objective of a number of scan cells in each of the plurality of repair register segments being close to a number derived by dividing a total number of scan cells in the plurality of repair register segments by a total number of the plurality of repair register segments.

16. The one or more non-transitory computer-readable media recited in claim 15, wherein the total number of the plurality of repair register segments is derived by computing a square root of one half of a product of the number of scan cells in the plurality of repair register segments and a number of repair register segments estimated to be included on the scan path, the number of repair register segments estimated to be included on the scan path being an estimated number of repair register segments in which memories have defects.

17. The one or more non-transitory computer-readable media recited in claim 13, wherein the segment selection bit generation circuitry comprises a one-detection device configurable to generate the segment selection bit.

18. The one or more non-transitory computer-readable media recited in claim 17, wherein the one-detection device comprises a storage element on the scan path, and each of the plurality of segment selection devices further comprises a zero-injection device with an output coupled to a serial input of the one of the plurality of repair register segments, the zero-injection device configurable to output a constant "0" during a process for generating the segment selection bit.

19. The one or more non-transitory computer-readable media recited in claim 17, wherein the one-detection device comprises a storage element outside the scan path.

20. The one or more non-transitory computer-readable media recited in claim 13, wherein the controller for the non-volatile storage device is configurable to enable the scan network to perform a one-detection process, the one-detection process comprises:
 loading the repair information from the repair information generation circuitry into the plurality of repair registers;
 injecting bits of "0" continuously at a serial input of each of the plurality of repair register segments; and
 applying a number of clock cycles equal to or greater than greatest length of a repair register segment within the plurality of repair register segments, length of a particular repair register segment being equal to a total number of scan cells in repair registers in the particular repair register segment.

21. The one or more non-transitory computer-readable media recited in claim 13, wherein the controller for the non-volatile storage device is configurable to enable the scan network to perform a process of configuration chain length determination, the process of configuration chain length determination comprises:
 injecting a leading bit of "1" at a serial input of the scan network;
 applying clock cycles to the scan network with each of the plurality of repair register segment being in a bypass mode until the leading bit of "1" appears at a serial output of the scan network; and
 storing a number of the clock cycles applied as configuration chain length.

22. The one or more non-transitory computer-readable media recited in claim 13, wherein the controller for the non-volatile storage device is configurable to enable the scan network to perform a process of effective chain length determination, the process of effective chain length determination comprises:
 injecting a leading bit of "1" at a serial input of the scan network;
 applying a number of clock cycles to the scan network with each of the plurality of segment selection devices being controlled by the segment selection bit until the leading bit of "1" appears at a serial output of the scan network; and
 storing a number of the clock cycles applied as the effective chain length.

23. The one or more non-transitory computer-readable media recited in claim 13, wherein the controller for the non-volatile storage device is configurable to enable the scan network to perform a power-up process, the power-up process comprises:
 resetting the scan network;
 injecting a leading bit of "1" followed by segment selection bits derived based on data stored in the non-volatile storage device at a serial input for the scan network;
 applying first clock cycles to the scan network with each of the plurality of repair register segment being in a bypass mode until the leading bit of "1" appears at a serial output of the scan network;
 updating configuration chain length based on a number of first clock cycles applied or reporting error if detected;
 resetting scan elements in the scan network;
 injecting a leading bit of "1" followed by bits of the repair information derived based on data stored in the non-volatile storage device at the serial input for the scan network;
 applying second clock cycles to the scan network with each of the plurality of segment selection devices being controlled by the segment selection bit until the leading bit of "1" appears at the serial output of the scan network; and
 updating effective chain length based on a number of second clock cycles applied or reporting error if detected.

24. The one or more non-transitory computer-readable media recited in claim 13, wherein the controller for the non-volatile storage device is configurable to enable the scan network to operate in a programming process, the programming process comprises:
 performing a power-up process;
 performing a test on the plurality of memories to generate new repair information;
 performing a one-detection process to generate new segment selection bits based on the new repair information;
 applying a number of clock cycles equal to configuration chain length to the scan network with each of the plurality of repair register segments being in a bypass mode to shift the new segment selection bits to the controller for the non-volatile storage device for storing and to update the storage element in each of the plurality of segment selection devices with the new segment selection bits;
 performing a process of effective chain length determination based on the new segment selection bits to generate a new effective chain length;
 loading the new repair information from the repair information generation circuitry into the plurality of repair registers; and
 applying a number of clock cycles equal to the new effective chain length to the scan network with the segment selection devices being controlled by the new segment selection bits to shift the new repair information to the controller for the non-volatile storage device for storing.

* * * * *